United States Patent
Morishita

(10) Patent No.: US 10,014,152 B2
(45) Date of Patent: Jul. 3, 2018

(54) METHOD OF ABERRATION CORRECTION AND CHARGED PARTICLE BEAM SYSTEM

(71) Applicant: JEOL Ltd., Tokyo (JP)

(72) Inventor: Shigeyuki Morishita, Tokyo (JP)

(73) Assignee: JEOL Ltd. (JP)

( * ) Notice: Subject to any disclaimer, the term of this patent is extended or adjusted under 35 U.S.C. 154(b) by 0 days.

(21) Appl. No.: 15/386,740

(22) Filed: Dec. 21, 2016

(65) Prior Publication Data

US 2017/0236681 A1  Aug. 17, 2017

(30) Foreign Application Priority Data

Dec. 22, 2015  (JP) ................... 2015-249731

(51) Int. Cl.
| | |
|---|---|
| *H01J 37/00* | (2006.01) |
| *H01J 37/141* | (2006.01) |
| *H01J 37/12* | (2006.01) |
| *H01J 37/145* | (2006.01) |

(52) U.S. Cl.
CPC ............ *H01J 37/141* (2013.01); *H01J 37/12* (2013.01); *H01J 37/145* (2013.01); *H01J 2237/1532* (2013.01); *H01J 2237/1534* (2013.01)

(58) Field of Classification Search
CPC ........ H01J 37/141; H01J 37/12; H01J 37/145; H01J 2237/1532; H01J 2237/1534
USPC ............... 250/396 R, 398, 396 ML
See application file for complete search history.

(56) References Cited

U.S. PATENT DOCUMENTS

2014/0054468 A1*  2/2014  Hosokawa ............ H01J 37/153
                                                      250/396 R

FOREIGN PATENT DOCUMENTS

JP        2012109076 A       6/2012

OTHER PUBLICATIONS

Rose, "Outline of a spherically corrected semiaplanatic medium-voltage transmission electron microscope", Optik, 1990, pp. 19-24, vol. 85, No. 1.
Haider et al., "Electron microscopy image enhanced", Nature, Apr. 23, 1998, pp. 768-769, vol. 392.
Sawada et al., "Correction of higher order geometrical aberration by triple 3-fold astigmatism field", Journal of Electron Microscopy, 2009, pp. 341-347, vol. 58, No. 6.
Sawada et al., "Higher-order aberration corrector for an image-forming system in a transmission electron microscope", Ultramicroscopy, 2010, pp. 958-961, vol. 110.

* cited by examiner

*Primary Examiner* — Nicole Ippolito
*Assistant Examiner* — Hanway Chang
(74) *Attorney, Agent, or Firm* — The Webb Law Firm

(57) ABSTRACT

There are disclosed an aberration correction method and a charged particle beam system capable of correcting off-axis first order aberrations. The aberration correction method is for use in the charged particle beam system (100) equipped with an aberration corrector (30) which has plural stages of multipole elements (32a, 32b) and a transfer lens system (34) disposed between the multipole elements (32a, 32b). The method includes varying the excitation of the transfer lens system (34) and correcting off-axis first order aberrations.

12 Claims, 15 Drawing Sheets

METHOD OF ABERRATION CORRECTION AND CHARGED PARTICLE BEAM SYSTEM

BACKGROUND OF THE INVENTION

Field of the Invention

The present invention relates to a method of aberration correction and a charged particle beam system.

Description of Related Art

In transmission electron microscopy, aberration correction is a technique that is important in obtaining high-resolution images.

For example, H. Rose, Optik, Vol. 85 (1990), pp. 19-24 and H. Haider et al., Nature, Vol. 392 (1998), pp. 768-769 disclose two-stage, three-fold field type spherical aberration correctors each having two stages of hexapole elements arranged therein. In these known spherical aberration correctors, positive spherical aberration in an objective lens is corrected by negative spherical aberration produced by the hexapole elements. Three-fold astigmatism produced in each hexapole element can also be canceled out by arranging the two stages of hexapole elements. In these two known spherical aberration correctors, up to the fourth order aberration can be corrected by axial alignment and other means. However, fifth-order, six-fold astigmatism cannot be corrected but rather remains as a dominant aberration.

H. Sawada et al., Journal of Electron Microscopy, Vol. 58 (2009), pp. 341-347 and H. Sawada et al., Ultramicroscopy 110 (2010), 958-961 disclose three-stage, three-fold field type spherical aberration correctors each having 3 stages of three-fold fields. Although the above-described two-stage, three-fold field type spherical aberration correctors cannot correct six-fold astigmatism, the spherical aberration correctors of H. Sawada et al., Journal of Electron Microscopy, Vol. 58 (2009), pp. 341-347 and H. Sawada et al., Ultramicroscopy 110 (2010), 958-961 correct six-fold astigmatism by means of three stages of three-fold fields.

JP-A-2012-109076 discloses a method of correcting five-fold astigmatism and three-lobe aberration in a three-stage, three-fold field type spherical aberration corrector. JP-A-2012-109076 also discloses a method of correcting on-axis aberrations.

As described previously, JP-A-2012-109076 discloses a method of correcting on-axis aberrations. However, there is not disclosed any method of correcting off-axis first order aberrations (defocus and two-fold astigmatism). Therefore, even if on-axis aberrations have been corrected in the center of the field of view, shifts of defocus and two-fold astigmatism may occur in off-center regions of the field of view.

SUMMARY OF THE INVENTION

In view of the foregoing problem, the present invention has been made. One object associated with some aspects of the present invention is to provide a method of correcting off-axis first order aberrations. Another object is to provide a charged particle beam system in which off-axis first order aberrations can be corrected.

(1) A method of aberration correction associated with the present invention is for use in a charged particle beam system equipped with an aberration corrector that includes plural stages of multipole elements and a transfer lens system disposed between the multipole elements. The method includes varying the excitation of the transfer lens system and correcting off-axis first order aberrations.

In this method of aberration correction, off-axis first order aberrations can be corrected in the charged particle beam system having the aberration corrector including the plural stages of multipole elements.

(2) In one feature of this method of aberration correction, the transfer lens system may include a first transfer lens and a second transfer lens.

(3) In one feature of the method of aberration correction of (2) above, during said step of correcting off-axis first order aberrations, the excitations of the first and second transfer lenses may be varied such that the first and second transfer lenses are both more strongly excited or both more weakly excited.

In this method of aberration correction, the amount by which the off-axis first order aberrations are varied can be made larger than the amount by which the on-axis aberrations are varied. Therefore, in this method of aberration correction, during the step of correcting off-axis first order aberrations, the amount by which the on-axis aberrations are varied can be reduced.

(4) In one feature of the method of aberration correction of (2) or (3) above, there may be further included the step of varying the excitation of the transfer lens system and correcting the on-axis aberrations.

In this method of aberration correction, on-axis aberrations that are induced concomitantly with correction of the off-axis first order aberrations can be reduced.

(5) In one feature of the method of aberration correction of (4) above, during the step of correcting on-axis aberrations, the excitations of the first and second transfer lenses may be varied such that one of the first and second transfer lenses is more strongly excited while the other is more weakly excited.

In this method of aberration correction, the amount by which the on-axis aberrations are varied can be made larger than the amount by which the off-axis first order aberrations are varied. Accordingly, in this method of aberration correction, during the step of correcting on-axis aberrations, the amount of variation of the off-axis first order aberrations can be reduced.

(6) In one feature of the method of aberration correction of (4) or (5) above, during the step of correcting on-axis aberrations, three-lobe aberration may be corrected.

(7) In one feature of the method of aberration correction of any one of (1) to (6) above, during the step of correcting off-axis first order aberrations, off-axis two-fold astigmatism may be corrected.

(8) In one feature of the method of aberration correction of any one of (1) to (7) above, each of the multipole elements may produce a three-fold field.

(9) In one feature of the method of aberration correction of any one of (1) to (8) above, there may be further included the step of measuring the off-axis first order aberrations. The step of measuring the off-axis first order aberrations includes the steps of: moving a field of view by deflection coils of the imaging system of the charged particle beam system and taking and obtaining plural amorphous images; obtaining plural diffractograms corresponding to the amorphous images; and measuring the off-axis first order aberrations on the basis of the diffractograms. During the step of correcting the off-axis first order aberrations, the off-axis first order aberrations may be corrected by varying the excitation of the transfer lens system on the basis of results of measurements of the off-axis first order aberrations.

In this method of aberration correction, the off-axis first order aberrations can be measured accurately.

(10) In one feature of the method of aberration correction of any one of (1) to (8) above, there may be further included the step of measuring the off-axis first order aberrations. This step of measuring the off-axis first order aberrations may include the steps of: obtaining an amorphous image; selecting mutually different plural regions from the amorphous image and obtaining plural diffractograms corresponding to the selected regions; and measuring the off-axis first order aberrations on the basis of the plural diffractograms. During the step of correcting the off-axis first order aberrations, the off-axis first order aberrations may be corrected by varying the excitation of the transfer lens system on the basis of results of measurements of the off-axis first order aberrations.

In this method of aberration correction, the off-axis first order aberrations can be measured from the single amorphous image and so the off-axis first order aberrations can be measured easily.

(11) A charged particle beam system associated with the present invention comprises: an aberration corrector having plural stages of multipole elements and a transfer lens system disposed between the multipole elements; a first measuring portion for measuring off-axis first order aberrations; and a first transfer lens system controller for providing control based on results of measurements made by the first measuring portion to vary the excitation of the transfer lens system such that the off-axis first order aberrations are corrected.

In this charged particle beam system, the off-axis first order aberrations can be corrected.

(12) In one feature of the charged particle beam system of (11) above, there may be further included: a second measuring portion for measuring on-axis aberrations; and a second transfer lens system controller for providing control based on results of measurements made by the second measuring portion to vary the excitation of the transfer lens system such that the on-axis aberrations are corrected.

In this charged particle beam system, it is possible to correct the on-axis aberrations which are introduced concomitantly with the correction of the off-axis first order aberrations.

DESCRIPTION OF THE INVENTION

The preferred embodiments of the present invention are hereinafter described in detail with reference to the drawings. It is to be understood that the embodiments described below are not intended to unduly restrict the content of the present invention delineated by the claims and that not all the configurations described below are essential constituent components of the invention.

An example is given below in which the charged particle beam system associated with the present invention is a transmission electron microscope for irradiating a sample with an electron beam and permitting observation of the sample. The charged particle beam system associated with the present invention may also be an instrument for irradiating a sample with a charged particle beam (such as ions) other than an electron beam and permitting observation of the sample.

1. First Embodiment 1.1. Transmission Electron Microscope

Figure 1:
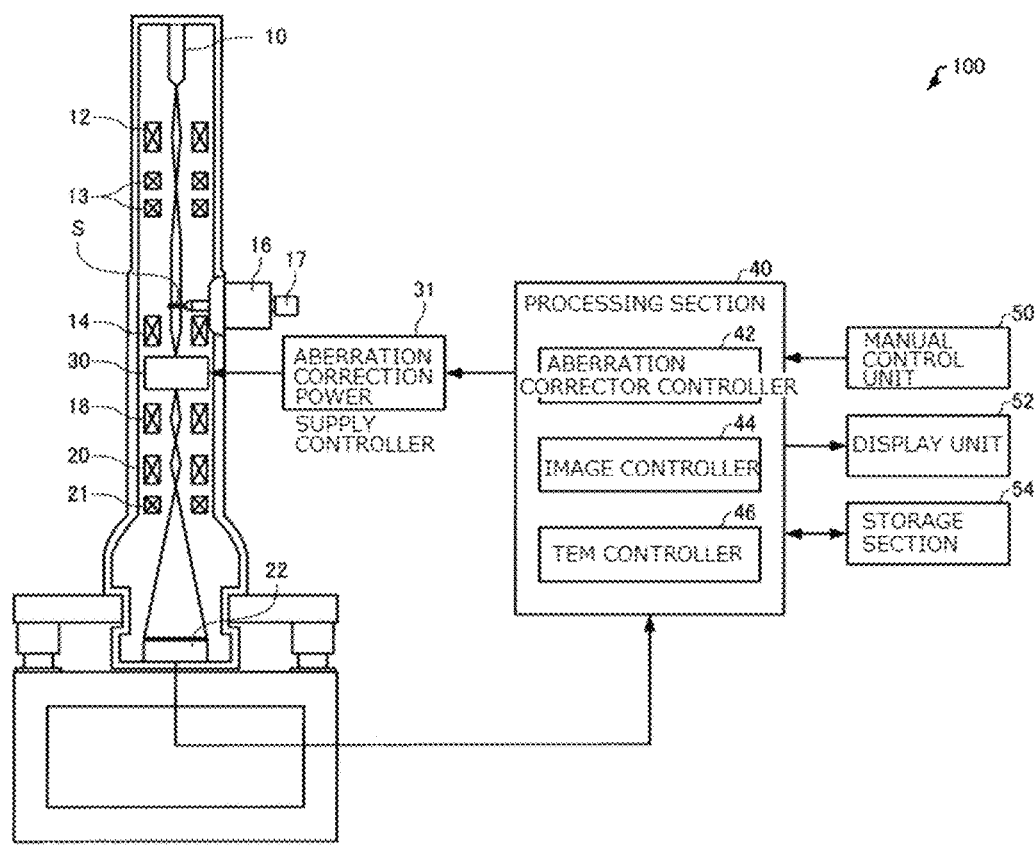
FIG. 1 is a schematic diagram, partly in block form, of a transmission electron microscope associated with a first embodiment of the present invention.

A transmission electron microscope (which is one example of charged particle beam system) associated with a first embodiment of the present invention is first described by referring to FIG. 1, which schematically shows the transmission electron microscope, 100, associated with the first embodiment.

As shown in FIG. 1, the transmission electron microscope 100 includes an electron source 10, a condenser lens system 12, alignment coils 13, an objective lens 14, a sample stage 16, a sample holder 17, an intermediate lens 18, a projector lens 20, deflection coils 21, an imager 22, a processing section 40, a manual control unit 50, a display unit 52, and a data storage section 54.

The electron source 10 produces electrons. For example, the electron source 10 is an electron gun which emits an electron beam by accelerating electrons, emitted from a cathode, by means of an anode.

The condenser lens system 12 focuses the electron beam, which is emitted from the electron source 10, onto a sample S.

The alignment coils 13 can deflect the electron beam focused by the condenser lens system 12. The alignment coils 13 are used, for example, to bring the axis of the electron beam into coincidence with the optical axis of the objective lens 14.

The objective lens 14 is an initial stage of lens for forming a transmission electron microscope (TEM) image from electrons transmitted through the sample S. The objective lens 14 has top and bottom polepieces (not shown). The objective lens 14 produces a magnetic field between its top and bottom polepieces to focus the electron beam.

The sample stage 16 holds the sample S. In the illustrated example, the sample stage 16 holds the sample S via the sample holder 17. The sample stage 16 places the sample S, for example, between the top and bottom polepieces of the objective lens 14. The sample stage 16 can move and stop the sample holder 17 and can place the sample S in position. The sample stage 16 can move the sample S in a horizontal direction perpendicular to the direction of travel of the electron beam and in a vertical direction along the direction of travel of the electron beam. Furthermore, the sample stage 16 can tilt the sample S.

The intermediate lens 18 and projector lens 20 cooperate to further magnify the image focused by the objective lens 14, and bring the image into focus on the imager 22. The objective lens 14, intermediate lens 18, and projector lens 20 together constitute an imaging system.

The deflection coils 21 are disposed behind the projector lens 20 and incorporated in the imaging system. The deflection coils 21 are used to deflect the electron beam emitted from the projector lens 20 so as to move the field of view being observed.

The imager 22 captures the TEM image focused by the imaging lens system. The imager 22 is a digital camera such as a CCD camera. The imager 22 outputs image data about the captured TEM image to the processing section 40.

An aberration corrector 30 is disposed behind the objective lens 14. In particular, the aberration corrector 30 is mounted between the objective lens 14 and the intermediate lens 18. The aberration corrector 30 is used to correct aberrations in the objective lens 14. More specifically, the aberration corrector 30 corrects the spherical aberration in the objective lens 14 of the imaging system by producing negative spherical aberration to cancel out the positive spherical aberration in the objective lens 14.

Figure 2:
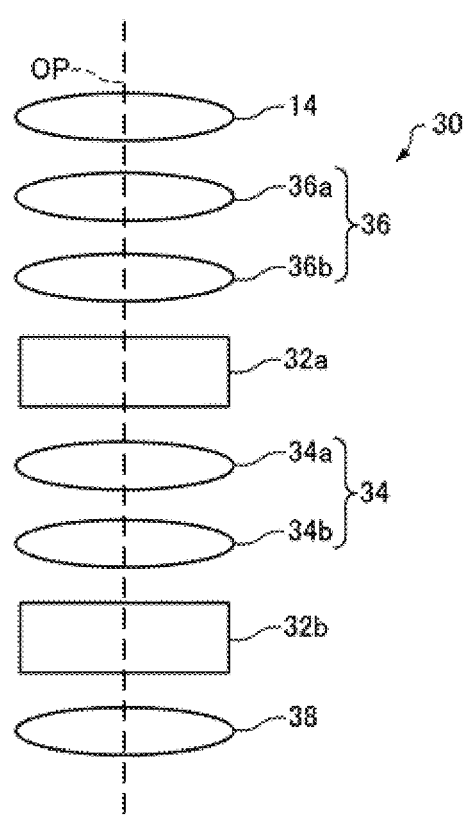
FIG. 2 is a schematic diagram of an aberration corrector included in the microscope shown in FIG. 1.

FIG. 2 schematically shows the aberration corrector 30. As shown in FIG. 2, the aberration corrector 30 is configured including two stages of multipole elements, i.e., a first multipole element 32a and a second multipole element 32b, and a transfer lens system 34.

In the aberration corrector 30, the first multipole element 32a and second multipole element 32b are arranged in a line along an optical axis OP.

The first multipole element 32a produces an N-fold field, i.e., N-fold symmetric field, where N is an integer. Similarly, the second multipole element 32b produces an N-fold field. In the following description, it is assumed that N=3. By an "N-fold field" it is meant that the intensity of the generated field has N-fold symmetry about the axis of rotational symmetry of a multipole element.

The first multipole element 32a is made of a hexapole element or a dodecapole element, for example. There are no limitations either on the number of the poles of the first multipole element 32a or on the number of poles of the second multipole element 32b. The three-fold field generated by the first multipole element 32a is a static electric field, a static magnetic field, or a superimposition of these fields.

The second multipole element 32b is identical in configuration to the first multipole element 32a. That is, the second multipole element 32b is made of a hexapole element or a dodecapole element, for example. The three-fold field generated by the second multipole element 32b is a static electric field, a static magnetic field, or a superimposition of these fields.

Each of the first multipole element 32a and second multipole element 32b has a thickness of t along the optical axis OP. In a multipole element having a thickness, aberrations different from aberrations induced in a thin multipole element are produced as combination aberrations.

Where a three-fold field is used as a multipole element, negative spherical aberration appears as a combination aberration. Utilizing this, positive spherical aberration in the objective lens 14 can be corrected.

The transfer lens system 34 is positioned between the first multipole element 32a and the second multipole element 32b. The transfer lens system 34 is made up of a pair of transfer lenses, i.e., a first transfer lens 34a and a second transfer lens 34b. An image conjugate to the image formed by the first multipole element 32a is formed in the second multipole element 32b by the transfer lens system 34.

Another transfer lens system 36 may be placed between the objective lens 14 and the first multipole element 32a. This transfer lens system 36 is made up of a pair of transfer lenses, i.e., a first transfer lens 36a and a second transfer lens 36b.

A post-collector lens 38 may be disposed between the second multipole element 32b and the intermediate lens 18. This lens 38 is used to bring an image of the sample S into focus on the image plane of the intermediate lens 18.

In the aberration corrector 30, the first multipole element 32a and the second multipole element 32b generate a pair of three-fold fields, which in turn result in negative spherical field. This reduces the positive spherical aberration possessed by the objective lens 14. The first multipole element 32a and the second multipole element 32b produce their respective three-fold astigmatisms which are equal in magnitude but opposite in sense. Consequently, the three-fold astigmatism produced in the first multipole element 32a is canceled out by the three-fold astigmatism generated in the second multipole element 32b.

The manual control unit 50 operates to obtain a control signal responsive to a user's manipulation and to send the signal to the processing section 40. The functions of the manual control unit 50 can be implemented by buttons, keys, a touch panel display, a microphone, or the like.

The user can perform an aberration correction (described later) by manipulating the manual control unit 50 to operate the various portions of the transmission electron microscope 100.

The display unit 52 provides a display of the image generated by the processing section 40. The function of the display unit 52 can be implemented an LCD, a CRT, or the like. A plurality of diffractograms (see FIG. 7) arranged so as to correspond to the positions of captured fields of view as described later is displayed on the display unit 52.

The storage section 54 stores programs, data, and related information permitting the processing section 40 to perform various calculational operations and control operations. Furthermore, the storage section 54 is used as a working area for the processing section 40. The storage section 54 is also used to temporarily store the results of calculations performed in accordance with various programs. The functions of the storage section 54 can be implemented by a hard disk, a RAM, or the like.

The processing section 40 performs various types of processing including control of the aberration corrector 30, acquisition of a TEM image captured by the imager 22, control of the electron optical components 12, 13, 14, 18, 20, 21 of the transmission electron microscope 100, and computations for Fourier transforming TEM images and generating diffractograms. The functions of the processing section 40 can be implemented either by hardware such as various processors (e.g., a CPU or a DSP) or by software. The processing section 40 includes an aberration corrector controller 42, an imager controller 44, and a TEM controller 46.

The aberration corrector controller 42 controls an aberration correction power supply controller 31, controlling the current or voltage supplied to the aberration corrector 30. Furthermore, the aberration corrector controller 42 controls the aberration corrector 30, for example, based on a preset value entered by the user via the manual control unit 50.

The aberration corrector controller 42 controls the aberration correction power supply controller 31, based on a control signal from the manual control unit 50, thus controlling excitation currents supplied to the first transfer lens 34a and second transfer lens 34b.

Based on a control signal from the manual control unit 50, the imager controller 44 controls the imager 22 such that the imager 22 captures a TEM image. Furthermore, the imager controller 44 obtains the captured TEM image and generates a diffractogram.

The TEM controller 46 controls the electron optical components 12, 13, 14, 18, 20, and 21 of the TEM 100, based on control signals from the manual control unit 50.

1.2. Method of Aberration Correction

A method of aberration correction associated with the first embodiment of the present invention is next described. In the present embodiment, an example is given in which off-axis first order aberrations produced in the aberration corrector 30 are corrected. In particular, in the present embodiment, a case is presented in which off-axis two-fold astigmatism is corrected so as to reduce the occurrence of the phenomenon where two-fold astigmatism is transformed into three-fold symmetry within the field of view.

The off-axis aberration referred to herein is one type of geometric aberration having a distance r from the optical axis as its parameter in addition to another parameter consisting of the angle α relative to the optical axis. The on-axis aberrations referred to below are aberrations having only one parameter consisting of the angle α relative to the optical axis. Note that first order aberrations include defocus and two-fold astigmatism.

In geometric optics, an electron orbit is described as motion of charged particles within an electromagnetic field. A deviation of an imaging point from an ideal imaging point (Gaussian imaging point) is referred to as a geometric aberration. Generally, an optical characteristic is represented by a power series polynomial equation which makes a mapping from one point on an object plane to one point on an image plane. This polynomial equation is power series expanded while taking the distance r from the optical axis of the electron orbit at the object plane and the angle α relative to the optical axis as parameters. Where only first order terms are taken into account regarding r and α, ideal imaging (Gaussian imaging) free from aberrations is represented. Where the second and higher order terms are taken into account, the imaging point deviates from the ideal imaging point. The sum of the order of the angle α made relative to the optical axis and the order of the distance r from the optical axis gives the order of the geometric aberration.

Figure 3:
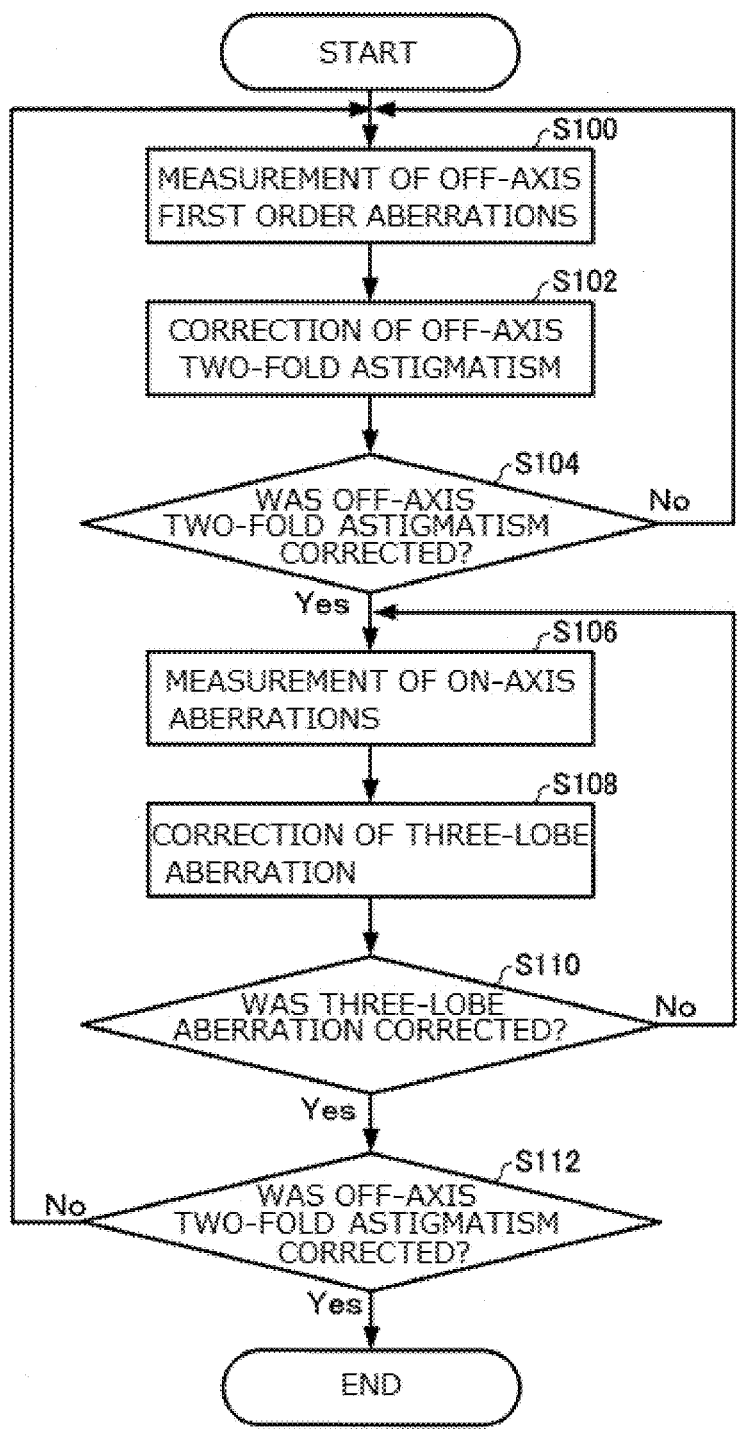
FIG. 3 is a flowchart illustrating one example of method of aberration correction associated with the first embodiment.

FIG. 3 is a flowchart illustrating one example of the method of aberration correction associated with the first embodiment.

(1) Measurement of Off-Axis First Order Aberrations (Step S100)

First, off-axis first order aberrations are measured. A process for measuring the off-axis first order, aberrations includes the steps of: moving a field of view by the deflection coils 21 of the imaging system and taking and obtaining plural amorphous images; obtaining plural diffractograms corresponding to the amorphous images; and measuring the off-axis first order aberrations on the basis of the diffractograms. These steps are described in detail below.

First, the field of view is moved by the deflection coils 21 of the imaging system of the transmission electron microscope 100 and taking and obtaining plural amorphous images.

Figure 4:
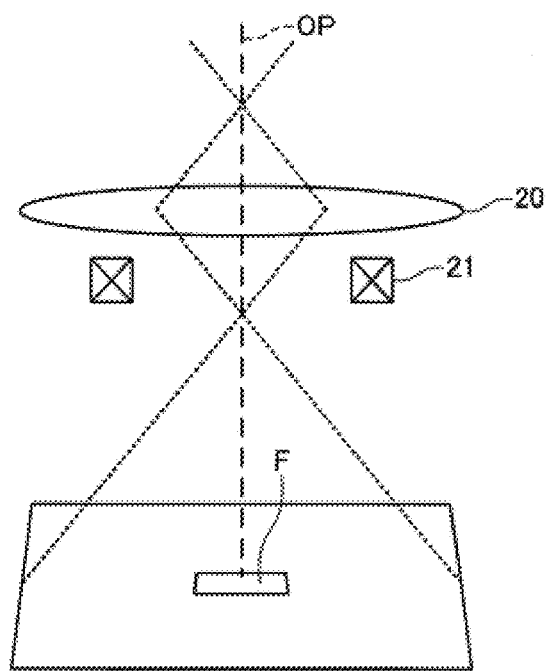
FIG. 4 is a schematic representation illustrating the manner in which amorphous images are obtained under the condition where the field of view is not moved by deflection coils.
Figure 5:
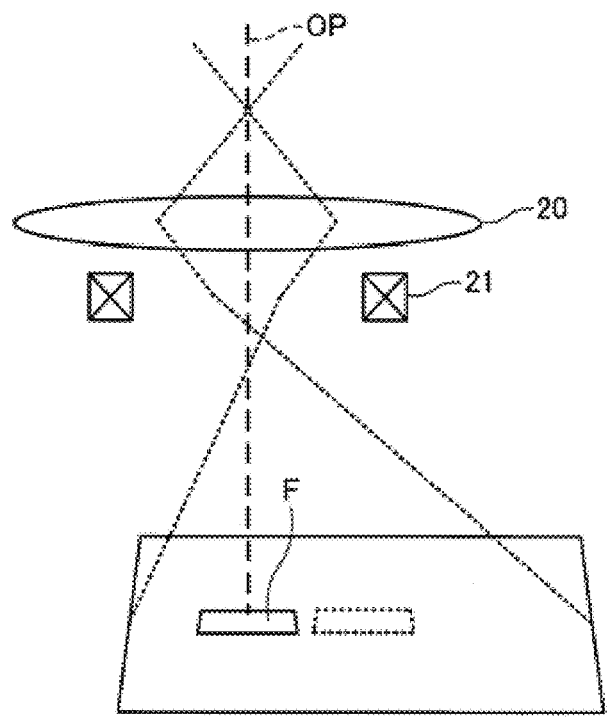
FIG. 5 is a schematic representation illustrating the manner in which the field of view is moved by the deflection coils and amorphous images are obtained.

FIGS. 4 and 5 schematically illustrate the manner in which the field of view is moved by the deflection coils 21 and amorphous images are obtained. FIG. 4 shows a condition where the field of view is not moved by the deflection coils 21. FIG. 5 shows a condition where the field of view has been moved by the deflection coils 21.

As shown in FIG. 5, the image plane of the projector lens 20 is moved using the deflection coils 21 to move the field of view F to be captured by the imager 22. By taking images while moving the field of view F captured by the imager 22 in this way, plural amorphous images taken in different fields of view F can be obtained. Each amorphous image is a TEM image derived by taking an amorphous region of the sample S.

Then, plural diffractograms corresponding to the plural amorphous images are obtained. The diffractograms corresponding to the amorphous images can be obtained by Fourier transforming the amorphous images.

Then, off-axis first order aberrations are measured based on the obtained diffractograms.

Figure 6:
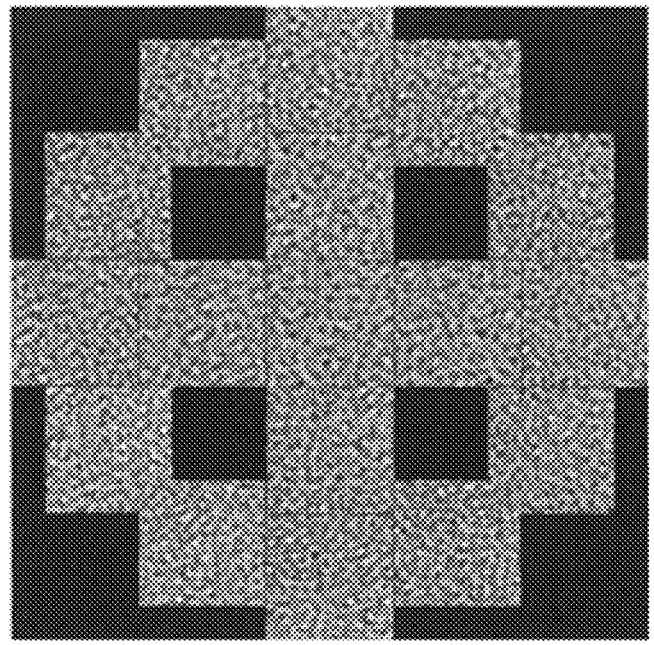
FIG. 6 is a view illustrating the manner in which plural amorphous images are arranged in a corresponding manner to the positions of captured fields of view.
Figure 7:
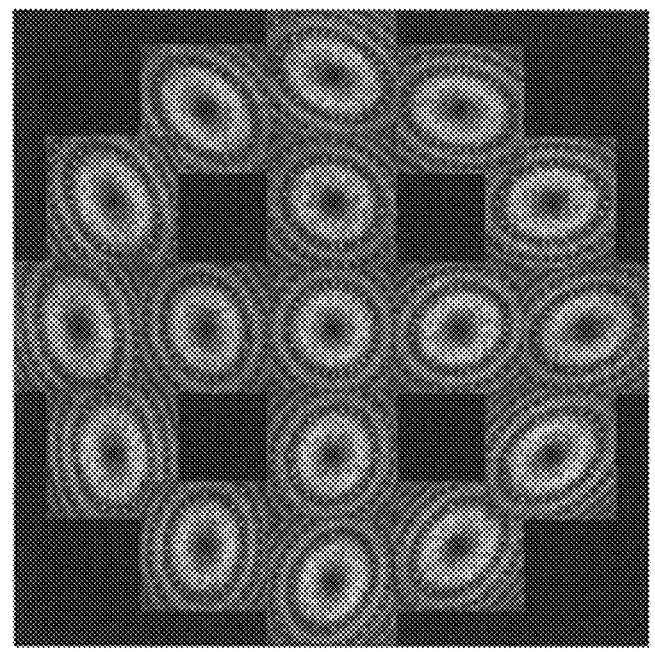
FIG. 7 is a view illustrating the manner in which plural diffractograms are arranged in a corresponding manner to the positions of captured fields of view.

FIG. 6 illustrates the manner in which the plural amorphous images are arranged to correspond to the positions of the captured fields of view. FIG. 7 illustrates the manner in which the plural diffractograms are arranged to correspond to the positions of the captured fields of view.

The plural diffractograms arranged to correspond to the positions of captured fields of view of FIG. 7 make it possible to visualize variations in off-axis first order aberrations, i.e., variations in off-axis defocus and variations in off-axis two-fold astigmatism.

In the example shown in FIG. 7, it can be seen from the diffractograms that two-fold astigmatism is different according to different positions of fields of view and that these two-fold astigmatisms vary in a triangular pattern.

In the present embodiment, the three-fold symmetric component of off-axis two-fold astigmatism may be quantified based on the plural diffractograms arranged in a corresponding manner to the positions of the captured fields of view. Because of the processing steps described so far, off-axis first order aberrations can be measured.

(2) Correction of Off-Axis Two-Fold Astigmatism (Step S102)

Then, the off-axis two-fold astigmatism is corrected based on the results of measurements of the off-axis first order aberrations. This correction is made by varying the excitation of the transfer lens system 34 disposed between the first multipole element 32a and the second multipole element 32b.

Figure 8:
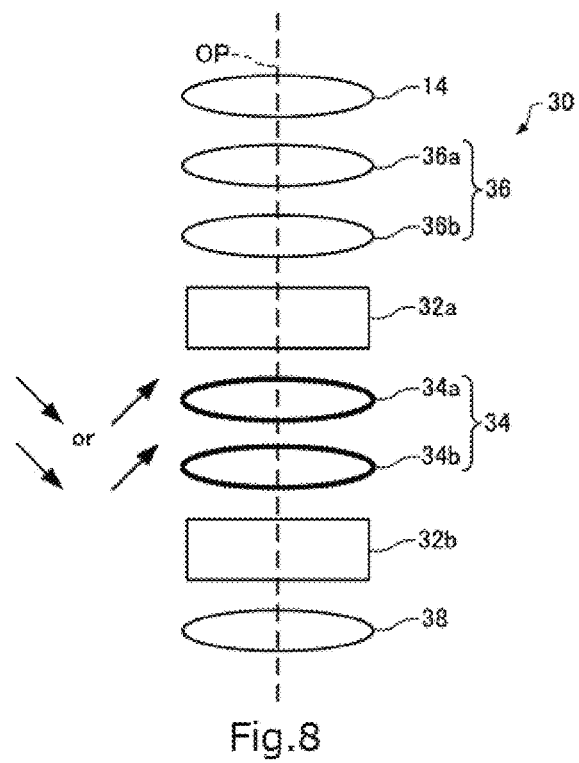
FIG. 8 is a schematic view illustrating the manner in which off-axis, two-fold astigmatism is corrected by varying the excitation of a transfer lens system.

FIG. 8 schematically illustrates the manner in which the excitation of the transfer lens system 34 is varied to correct off-axis two-fold astigmatism. As shown in FIG. 8, the correction of off-axis two-fold astigmatism is carried out by varying the excitations of the first transfer lens 34a and the second transfer lens 34b such that both of the lenses 34a, 34b become more strongly excited or both become more weakly excited.

When the excitations of the first transfer lens 34a and second transfer lens 34b are varied, off-axis aberrations (more specifically, three-lobe aberration) vary together with the off-axis two-fold astigmatism. As described previously, the excitations of the first transfer lens 34a and second transfer lens 34b are both varied to increase. When the excitations of the first transfer lens 34a and second transfer lens 34b are varied to decrease, the amount of variation of the off-axis two-fold astigmatism can be made larger than the amount of variation of the three-lobe aberration. The three-lobe aberration is one of fourth order on-axis geometric aberration, and is a parasitic aberration of three-fold symmetry.

The excitation of the first transfer lens 34a can be varied by changing the excitation current to the coil of the first transfer lens 34a. The second transfer lens 34b can be similarly operated.

In the present step, the excitations of the first transfer lens 34a and second transfer lens 34b are varied based on the results of measurements of the off-axis first order aberrations (step S100). Specifically, the excitations of the first transfer lens 34a and second transfer lens 34b are varied to reduce the off-axis two-fold astigmatism in the diffractograms shown in FIG. 7.

For example, the user may vary the excitations of the transfer lenses 34a and 34b by visually checking the condition of the off-axis two-fold astigmatism from the plural diffractograms (see FIG. 7) displayed on the display unit 52 and manipulating the manual control unit 50 to reduce the off-axis two-fold astigmatism. Furthermore, the user may vary the excitations of the transfer lenses 34a and 34b so as to reduce the off-axis two-fold astigmatism while checking the quantitative value of the three-fold symmetric component of the off-axis two-fold astigmatism displayed on the display unit 52.

(3) Decision as to Whether OFF-Axis Two-Fold Astigmatism has been Corrected (Step S104)

Then, a decision is made as to whether the off-axis two-fold astigmatism has been corrected. This decision is performed by measuring off-axis first order aberrations (off-axis two-fold astigmatism) using a technique similar to the step S100 of measuring off-axis first order aberrations.

The user makes a decision as to whether the off-axis two-fold astigmatism has been reduced, for example, on the basis of the diffractograms shown on the display unit 52. Furthermore, the user may determine that the off-axis two-fold astigmatism has been corrected if the quantitative value of the three-fold symmetric component of the off-axis two-fold astigmatism quantified based on the plural diffractograms is less than a given value. If the quantitative value is greater than the given value, the user may determine that the off-axis two-fold astigmatism has not been corrected.

If the decision at step S104 is negative (No), indicating that the off-axis two-fold astigmatism has not been corrected, control returns to step S100, and then the step 100 of measuring off-axis first order aberrations and the step S102 of correcting off-axis two-fold astigmatism are again performed.

(4) Measurement of On-Axis Aberrations (Step S106)

On the other hand, if the decision at step S104 is affirmative (Yes), indicating that the off-axis two-fold astigmatism has been corrected, on-axis aberrations are measured.

As described previously, if the excitations of the first transfer lens 34a and the second transfer lens 34b are varied in order to correct off-axis two-fold astigmatism, three-lobe aberration that is one kind of on-axis aberration also varies. This necessitates correction of the three-lobe aberration.

A measurement of on-axis aberrations (three-lobe aberration) is made, for example, by a diffractogram tableau method in which diffractograms of amorphous images are arranged in two dimensions after the amorphous images are taken by tilting an incident beam at an angle of about 1 to 2 degrees and incrementally varying the azimuthal angle. On-axis aberrations can be measured by utilizing the ellipticity and symmetry of a geometric figure appearing on the two-dimensional array of the diffractograms.

(5) Correction of Three-Lobe Aberration (Step S108)

Then, the three-lobe aberration is corrected based on the result of the measurement of the on-axis aberrations. This correction is performed by varying the excitation of the transfer lens system 34 disposed between the first multipole element 32a and second multipole element 32b.

Figure 9:
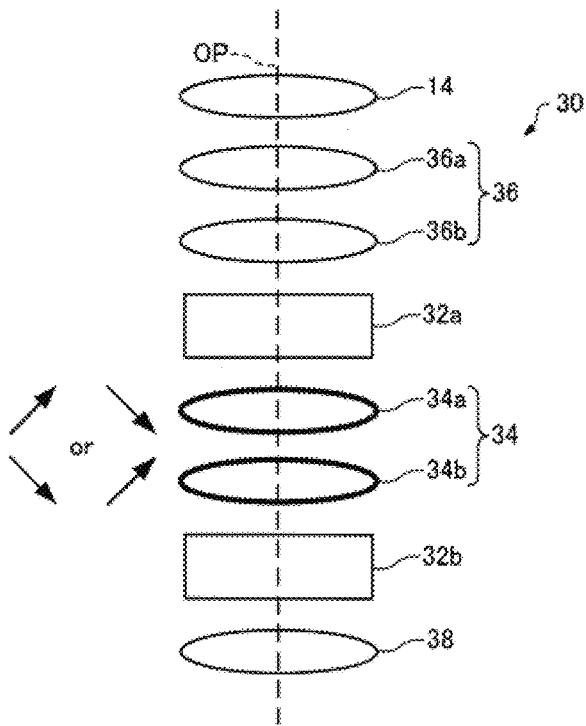
FIG. 9 is a schematic view illustrating the manner in which three-lobe aberration is corrected by varying the excitation of the transfer lens system.

FIG. 9 schematically illustrates the manner in which the excitation of the transfer lens system 34 is varied to correct the three-lobe aberration.

The correction of the three-lobe aberration is performed by varying the excitation of one of the first transfer lens 34a and second transfer lens 34b so as to increase it and varying the excitation of the other so as to reduce it as shown in FIG. 9. Thus, the transfer distance can be varied. Consequently, the three-lobe aberration can be corrected. By varying the excitations of the transfer lenses 34a and 34b in this way, the amount of variation of the three-lobe aberration can be made larger than the amount of variation of the off-axis two-fold astigmatism.

In the present step, the excitations of the first transfer lens 34a and second transfer lens 34b are varied based on the result of the measurement of the on-axis aberrations performed at step S106.

(6) Decision as to Whether Three-Lobe Aberration has been Corrected (Step S110)

A decision is then made as to whether the three-lobe aberration has been corrected. This decision is effected by creating a diffractogram tableau and measuring on-axis aberrations (three-lobe aberration) from the diffractogram tableau in the same way as in the step S106 of measuring on-axis aberrations.

If the decision at step S110 is negative (No), indicating that the three-lobe aberration has not been corrected, control goes back to step S106, and then the step S106 of measuring on-axis aberrations and the step S108 of correcting three-lobe aberration are repeated.

(7) Decision as to Whether Off-Axis Two-Fold Astigmatism has been Corrected (Step S112)

On the other hand, if the decision at step S112 is affirmative (Yes), indicating that the three-lobe aberration has been corrected, a decision is made as to whether off-axis two-fold astigmatism has been corrected. This decision is performed similarly to step S104.

If the decision at step S112 is negative (No), indicating that the off-axis two-fold astigmatism has not been corrected, control proceeds back to step S100, and the steps S100-S110 are again performed.

On the other hand, if the decision at step S112 is Yes, indicating that the off-axis two-fold astigmatism has been corrected, the aberration correction is ended. Because of the processing steps described so far, the off-axis two-fold astigmatism can be corrected.

The method of aberration correction associated with the first embodiment has the following features. The method of aberration correction associated with the first embodiment includes the step of varying the excitation of the transfer lens system 34 to correct off-axis two-fold astigmatism. Therefore, this method of aberration correction permits off-axis two-fold astigmatism to be corrected in the transmission electron microscope (TEM) 100 having the aberration corrector 30 that has the two stages of multipole elements 32a, 32b. Consequently, with the TEM 100, high-resolution images can be obtained in a wide range of field of view.

In the method of aberration correction associated with the first embodiment, during the step of correcting off-axis two-fold astigmatism, the excitations of the first transfer lens 34a and the second transfer lens 34b are so varied that both lenses are more strongly excited or both lenses are more weakly excited. Therefore, the amount of variation of the off-axis two-fold astigmatism can be made larger than the amount of variation of three-lobe aberration. Consequently, in the method of aberration correction associated with the first embodiment, during the step of correcting off-axis two-fold astigmatism, the amount of variation of three-lobe aberration can be reduced.

The method of aberration correction associated with the first embodiment includes the step of correcting three-lobe aberration by varying the excitation of the transfer lens system 34. Therefore, with the method of aberration correction associated with the first embodiment, three-lobe aberration occurring concomitantly with correction of off-axis two-fold astigmatism can be corrected. As a result, better high-resolution images can be derived.

In the method of aberration correction associated with the first embodiment, during the step of correcting three-lobe aberration, the excitation of one of the first transfer lens 34a and the second transfer lens 34b is varied to grow stronger, while the excitation of the other is varied to weaken. As a consequence, the amount of variation of three-lobe aberration can be made larger than the amount of variation of off-axis two-fold astigmatism. Hence, in the method of aberration correction associated with the first embodiment, during the step of correcting three-lobe aberration, the amount of variation of off-axis two-fold astigmatism can be reduced.

In the method of aberration correction associated with the first embodiment, the step of measuring off-axis first order aberrations includes the steps of: obtaining plural amorphous images by taking plural amorphous images while moving a field of view by the deflection coils 21 of the imaging system; obtaining plural diffractograms corresponding to the plural amorphous images; and measuring off-axis first order aberrations on the basis of the plural diffractograms. Therefore, off-axis first order aberrations can be measured.

Furthermore, in the method of aberration correction associated with the first embodiment, plural diffractograms are obtained from plural amorphous images. Therefore, the pixel size of each of the amorphous images can be made larger, for example, than where plural diffractograms are obtained from a single amorphous image (see "1.3. Modification of Method of Aberration Correction" below). In consequence, off-axis first order aberrations can be measured with higher accuracy.

1.3. Modification of Method of Aberration Correction

In the above embodiment, during the step of measuring off-axis first order aberrations, there are obtained plural diffractograms corresponding to plural amorphous images obtained while moving the field of view by the deflection coils 21. The step of measuring off-axis first order aberrations is not restricted to this.

For example, the step of measuring off-axis first order aberrations may include the steps of: obtaining an amorphous image; selecting mutually different plural regions from the amorphous image and obtaining plural diffractograms corresponding to the selected regions; and measuring off-axis first order aberrations on the basis of the plural diffractograms.

Figure 10:
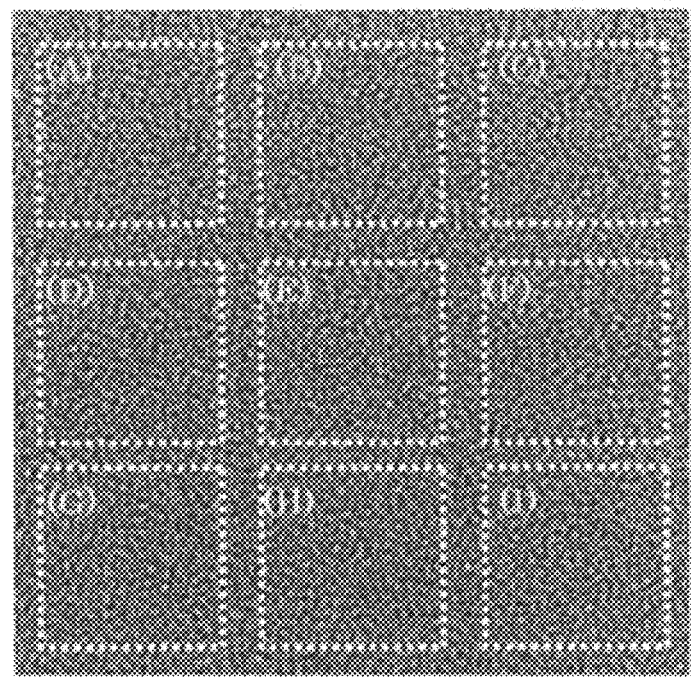
FIG. 10 is a view showing a condition where mutually different plural regions have been selected from an amorphous image.

FIG. 10 shows a condition where the mutually different plural regions have been selected from the amorphous image. In the present modification, as shown in FIG. 10, a single amorphous image is taken and plural regions are selected from the single amorphous image. In the illustrated example, 9 regions are selected from a single amorphous image. There is no restriction on the number of the selected regions.

Figure 11:
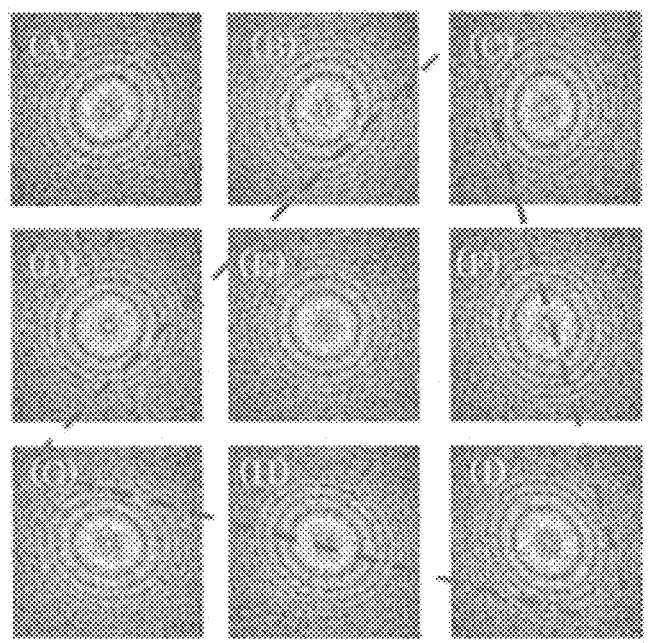
FIG. 11 is a view illustrating the manner in which the plural diffractograms corresponding to the selected regions are arranged at positions corresponding to the selected regions.

FIG. 11 illustrates the manner in which plural diffractograms corresponding to selected plural regions are placed at positions corresponding to the selected regions. The diffractograms can be obtained by Fourier transforming the selected regions. Off-axis first order aberrations can be visualized by placing the diffractograms at positions corresponding to the selected regions as shown in FIG. 11.

Even the plural diffractograms of FIG. 11 obtained in this way permit measurement of off-axis first order aberrations in the same way as the diffractograms shown in FIG. 7.

In the present modification, off-axis first order aberrations can be measured from a single amorphous image and so the off-axis first order aberrations can be measured easily.

2. Second Embodiment 2.1. Transmission Electron Microscope

Figure 12:
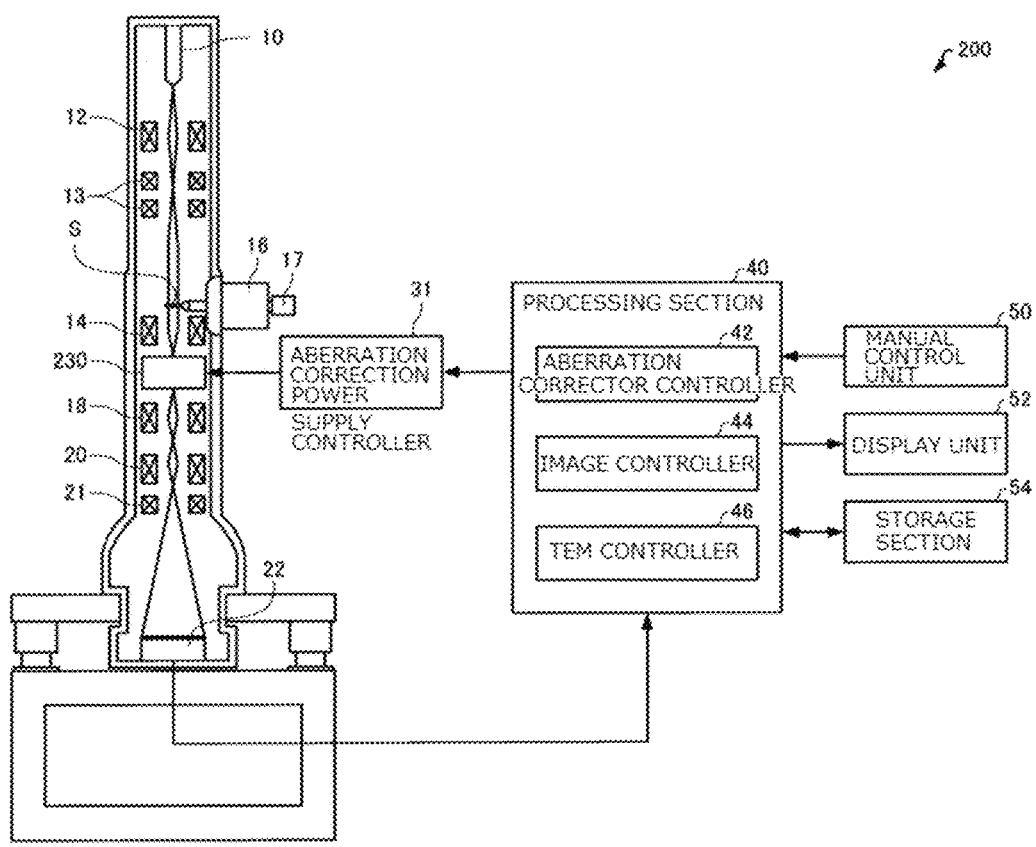
FIG. 12 is a schematic diagram, partly in block form, of a transmission electron microscope associated with a second embodiment.
Figure 13:
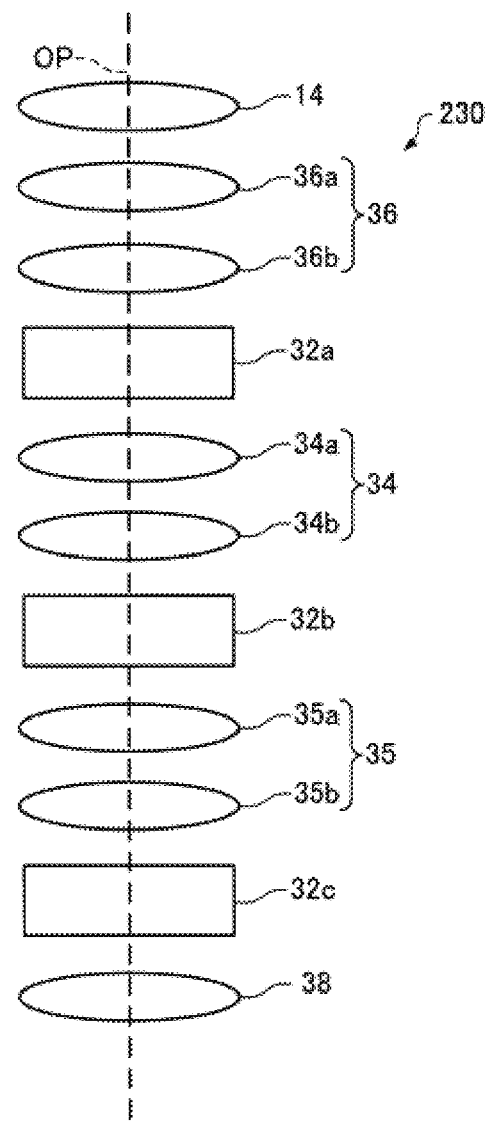
FIG. 13 is a schematic view of an aberration corrector included in the transmission electron microscope shown in FIG. 12.

A transmission electron microscope associated with a second embodiment of the present invention is next described by referring to FIGS. 12 and 13. FIG. 12 schematically shows the transmission electron microscope, generally indicated by reference numeral 200, associated with the second embodiment. FIG. 13 schematically shows an aberration corrector 230 of the transmission electron microscope 200.

Those members of the transmission electron microscope 200 associated with the second embodiment which are similar in function to their respective counterparts of the transmission electron microscope 100 associated with the first embodiment are hereinafter indicated by the same reference numerals as in the above referenced figures and a detailed description thereof is omitted.

In the above-described transmission electron microscope 100, as shown in FIG. 2, the aberration corrector 30 has two stages of multipole elements 32a and 32b. That is, the aberration corrector 30 is a two-stage, three-fold field type spherical aberration corrector.

On the other hand, in the transmission electron microscope 200, as shown in FIG. 13, the aberration corrector 230 has three stages of multipole elements 32a, 32b, 32c. That is, the aberration corrector 230 is a three-stage, three-fold field type spherical aberration corrector.

The aberration corrector 230 is configured including the three stages of multipole elements (first multipole element 32a, second multipole element 32b, and third multipole element 32c) together with a first transfer lens system 34 and a second transfer lens system 35.

In the aberration corrector 30, the first multipole element 32a, second multipole element 32b, and third multipole element 32c are arrayed in a line along the optical axis OP.

The first multipole element 32a, second multipole element 32b, and third multipole element 32c are similar in configuration to the first multipole element 32a and second multipole element 32b of the above-described first embodiment and so a description thereof is omitted.

The first transfer lens system 34 is disposed between the first multipole element 32a and the second multipole element 32b. The second transfer lens system 35 is positioned between the second multipole element 32b and the third multipole element 32c. The second transfer lens system 35 has a first transfer lens 35a and a second transfer lens 35b.

The first transfer lens system 34 and second transfer lens system 35 are similar in configuration to the transfer lens system 34 of the above-described first embodiment and so a description thereof is omitted.

In the aberration corrector 30, three-fold astigmatism generated in the first multipole element 32a is canceled out by three-fold astigmatism produced in the second multipole element 32b as described previously. However, in the aberration corrector 30, three-fold astigmatism is canceled out by a pair of three-fold fields generated by the first multipole element 32a and second multipole element 32b and consequently a six-fold astigmatism being a fifth order aberration is newly induced.

In the aberration corrector 230, six-fold astigmatism is canceled out by establishing a particular angular relationship among the three-fold fields generated by the first multipole element 32a, second multipole element 32b, and third multipole element 32c.

2.2. Method of Aberration Correction

A method of aberration correction associated with the second embodiment is next described. The method of aberration correction associated with the second embodiment is similar to the method of aberration correction associated with the first embodiment except for both step S102 of correcting off-axis two-fold astigmatism and step S108 of correcting three-lobe aberration.

Only the differences of the method of aberration correction associated with the second embodiment with the method of aberration correction associated with the first embodiment are described below; a description of similarities is omitted.

First, a step (step S102) of correcting off-axis two-fold astigmatism is described. In the present embodiment, correction of off-axis two-fold astigmatism is performed by varying the excitations of the first and second transfer lens systems 34 and 35, respectively, the first system 34 being disposed between the first multipole element 32a and the second multipole element 32b, the second system 35 being disposed between the second multipole element 32b and the third multipole element 32c.

Figure 14:
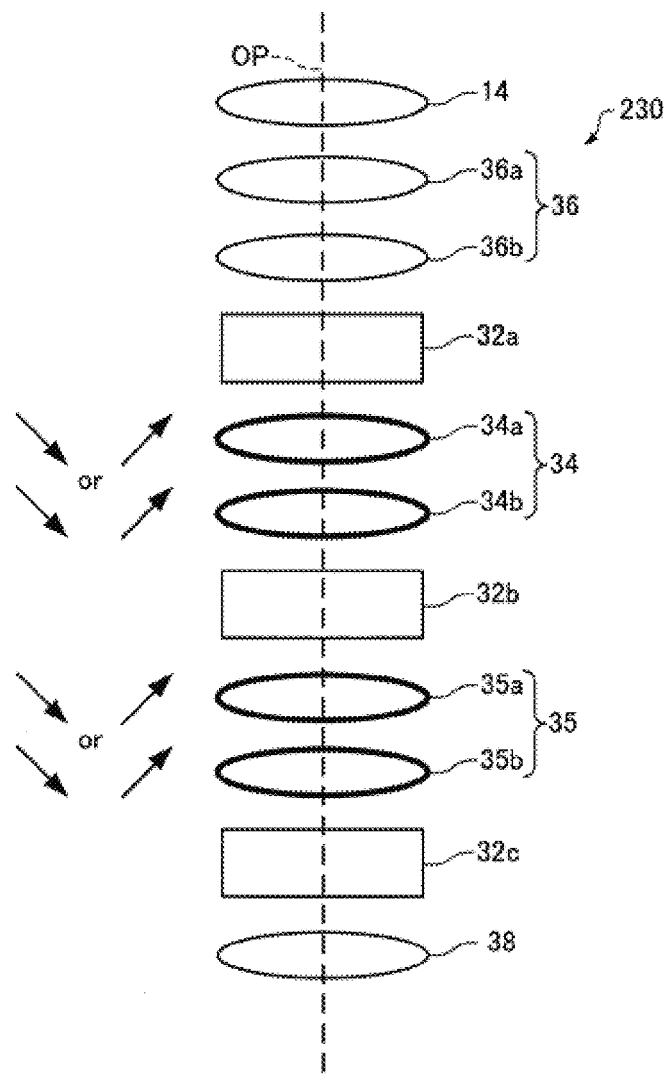
FIG. 14 is a view illustrating the manner in which off-axis, two-fold astigmatism is corrected by varying the excitations of first and second transfer lens systems.
Figure 15:
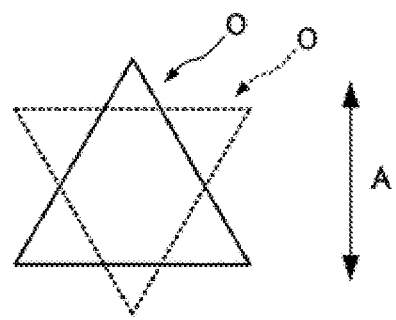
FIG. 15 is a schematic representation of the three-fold symmetric component of off-axis two-fold astigmatism which varies concomitantly with variation of the excitation of the first transfer lens system.
Figure 16:
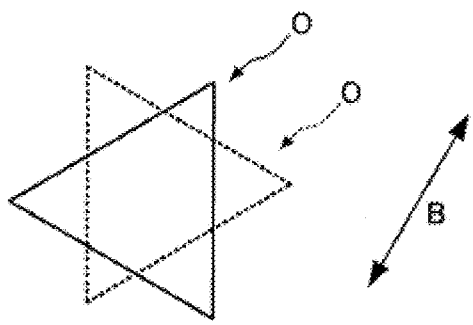
FIG. 16 is a schematic representation of the three-fold symmetric component of off-axis two-fold astigmatism which varies concomitantly with variation of the excitation of the second transfer lens system.

FIG. 14 illustrates the manner in which the excitations of the first transfer lens system 34 and second transfer lens system 35 are varied to correct off-axis two-fold astigmatism. FIG. 15 schematically shows a three-fold symmetric component O of the off-axis two-fold astigmatism varying concomitantly with variation of the excitation of the first transfer lens system 34. FIG. 16 schematically shows a three-fold symmetric component O of the off-axis two-fold astigmatism varying concomitantly with variation of the excitation of the second transfer lens system 35.

Since the above-described aberration corrector 30 has the two stages of multipole elements 32a, 32b, the three-fold symmetric component of the off-axis two-fold astigmatism is directed in a certain one direction. That is, in an arrangement of plural diffractograms disposed in a corresponding manner to the positions of captured fields of view, a triangle drawn by the two-fold astigmatism faces in the same direction at all times.

On the other hand, the aberration corrector 230 has three stages of multipole elements 32a, 32b, and 32c and so the three-fold symmetric component of the off-axis two-fold astigmatism faces in various directions. That is, in an arrangement of diffractograms disposed in a corresponding manner to the positions of captured fields of view, a triangle drawn by the two-fold astigmatism faces in various directions.

Therefore, in the present embodiment, as shown in FIG. 14, the excitations of the first transfer lens 34a and second transfer lens 34b are varied such that both lenses are more strongly excited or alternatively both lenses are more weakly excited. As a result, as shown in FIG. 15, the three-fold symmetric component O of off-axis two-fold astigmatism lying in the direction A (given direction) can be varied. Hence, the three-fold symmetric component O of the off-axis two-fold astigmatism in the direction A can be corrected.

Similarly, the excitations of the first transfer lens 35a and the second transfer lens 35b are varied such that both lenses are more strongly excited. Alternatively, the excitations of the lenses 35a and 35b are varied such that both lenses are more weakly excited. Consequently, as shown in FIG. 16, the three-fold symmetric component O of the off-axis two-fold astigmatism lying in a direction B different from the direction A can be varied. This three-fold symmetric component O of the off-axis two-fold astigmatism in the direction B can be corrected.

In the transmission electron microscope 200 equipped with the aberration corrector 230 that includes the three stages of multipole elements 32a, 32b, and 32c, off axis two-fold astigmatism can be corrected by varying the excitations of the first transfer lens system 34 and second transfer lens system 35 as described previously.

A step (step S108) of correcting three-lobe aberration is next described. In the present embodiment, a correction of three-lobe aberration is carried out by varying the excitation of the first transfer lens system 34 disposed between the first multipole element 32a and second multipole element 32b and the excitation of the second transfer lens system 35 disposed between the second multipole element 32b and third multipole element 32c.

Figure 17:
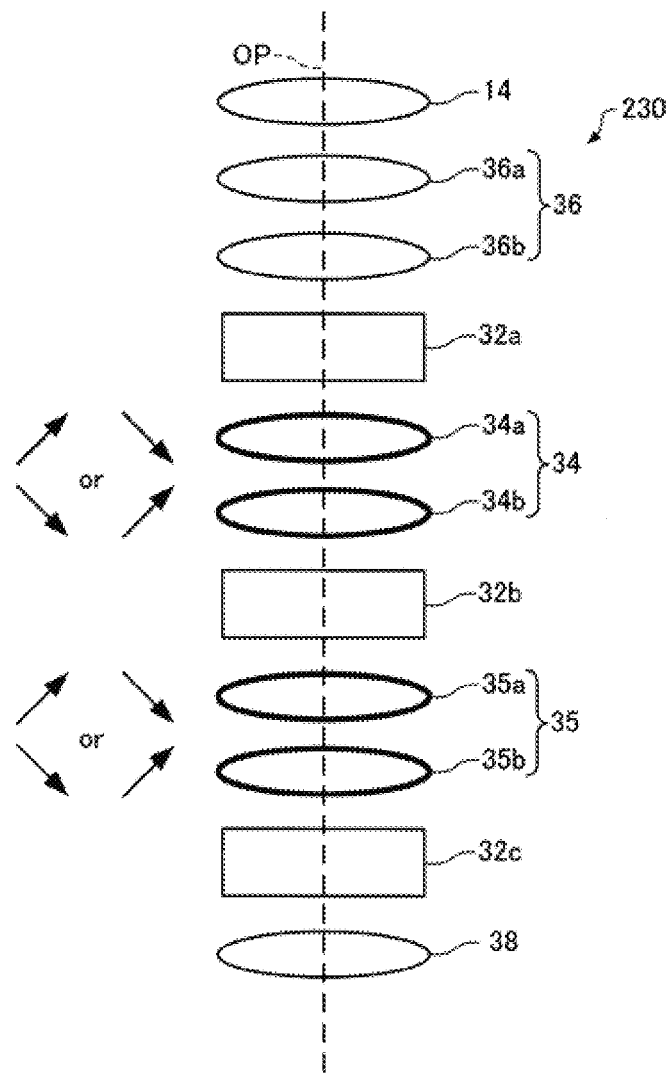
FIG. 17 is a view illustrating the manner in which three-lobe aberration is corrected by varying the excitations of the first and second transfer lens systems.
Figure 18:
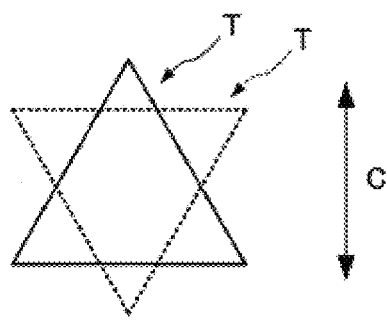
FIG. 18 is a schematic representation of three-lobe aberration which varies concomitantly with variation of the excitation of the first transfer lens system.
Figure 19:
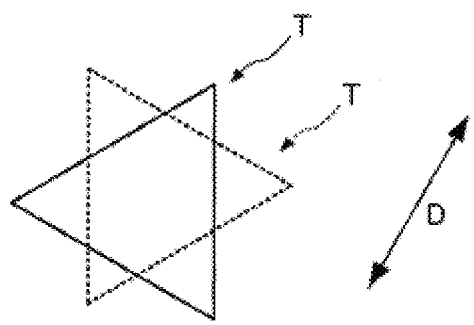
FIG. 19 is a schematic representation of three-lobe aberration which varies concomitantly with variation of the excitation of the second transfer lens system.

FIG. 17 illustrates the manner in which three-lobe aberration is corrected by varying the excitations of the first transfer lens system 34 and second transfer lens system 35. FIG. 18 schematically illustrates three-lobe aberration T varying concomitantly with variation of the excitation of the first transfer lens system 34. FIG. 19 schematically illustrates three-lobe aberration T varying concomitantly with variation of the excitation of the second transfer lens system 35.

The above-described aberration corrector 30 has the two stages of multipole elements 32a and 32b and so three-lobe aberration faces only in one given direction. In contrast, the aberration corrector 230 has the three stages of multipole elements 32a, 32b, and 32c and, therefore, three-lobe aberration faces in various directions.

Therefore, in the present embodiment, as shown in FIG. 17, the excitations of the first and second transfer lenses 34a, 34b are varied such that one transfer lens becomes more strongly excited while the other becomes more weakly excited. Consequently, as shown in FIG. 18, three-lobe aberration T in a given direction C can be varied and thus can be corrected.

Similarly, the excitations of the first and second transfer lenses 35a, 35b are so varied that one of the transfer lenses becomes more strongly excited while the other becomes more weakly excited. As a result, as shown in FIG. 19, three-lobe aberration T lying in a direction D different from the direction C can be varied and thus can be corrected.

As noted above, in the transmission electron microscope 200 equipped with the aberration corrector 230 having the three stages of multipole elements 32a, 32b, and 32c, three-lobe aberration can be corrected by varying the excitations of the first transfer lens system 34 and second transfer lens system 35.

In the method of aberration correction associated with the second embodiment, off-axis two-fold astigmatism can be corrected in the transmission electron microscope 200 equipped with the aberration corrector 230 having the three stages of multipole elements 32a, 32b, and 32c.

3. Third Embodiment 3.1. Electron Microscope

Figure 20:
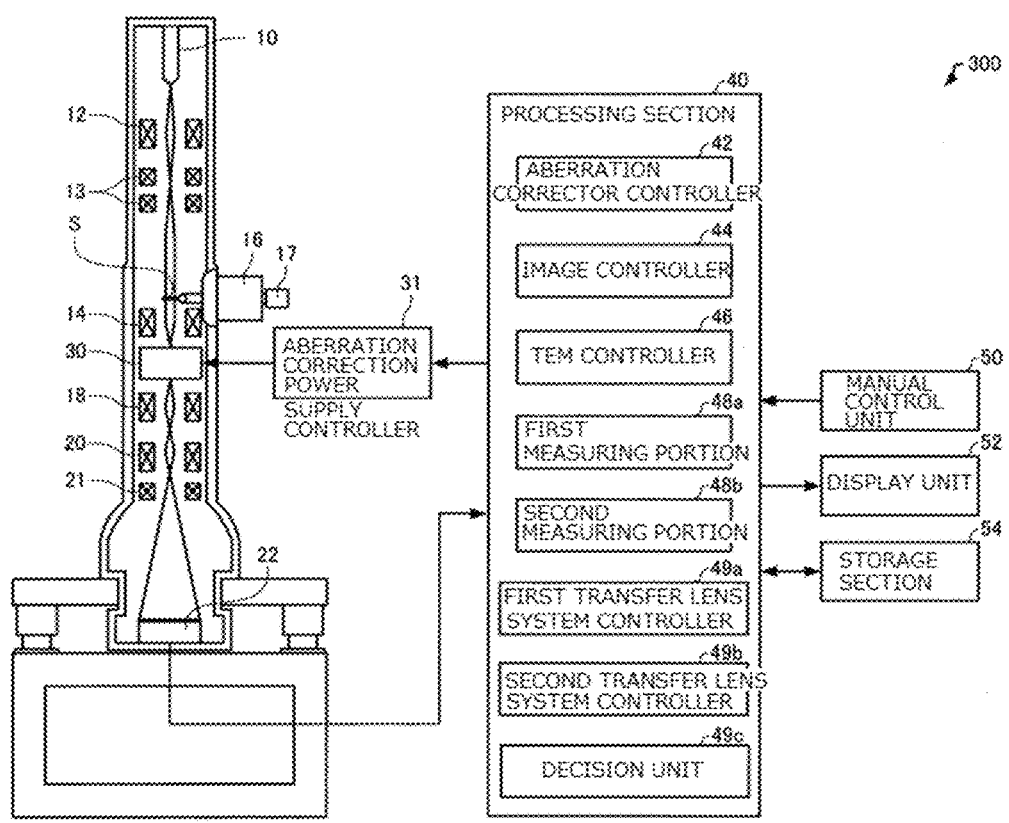
FIG. 20 is a schematic diagram, partly in block form, of a transmission electron microscope associated with a third embodiment.

A transmission electron microscope associated with a third embodiment is next described by referring to FIG. 20, which schematically shows the transmission electron microscope, generally indicated by reference numeral 300, associated with the third embodiment.

Those members of the transmission electron microscope 300 associated with the third embodiment which are similar in function to their respective counterparts of the transmission electron microscope 100 associated with the first embodiment are hereinafter indicated by the same reference numerals as in the above referenced figures and a detailed description thereof is omitted.

As shown in FIG. 20, the transmission electron microscope 300 is different from the transmission electron microscope 100 in that the processing section 40 includes a first measuring portion 48a, a second measuring portion 48b, a first transfer lens system controller 49a, a second transfer lens system controller 49b, and a decision unit 49c.

The first measuring portion 48a performs processing to measure off-axis first order aberrations. The first measuring portion 48a operates, for example, to control the deflection coils 21 and imager 22, to take plural amorphous images while moving the field of view, and to obtain the plural amorphous images. The first measuring portion 48a Fourier transforms the amorphous images to obtain plural diffractograms corresponding to the plural amorphous images, and measures the off-axis first order aberrations. The first measuring portion 48a quantifies the three-fold symmetric component of the off-axis two-fold astigmatism from the plural diffractograms.

The first transfer lens system controller 49a provides control based on the results of measurements made by the first measuring portion 48a to vary the excitation of the transfer lens system 34 such that the off-axis two-fold astigmatism is corrected. The first transfer lens system controller 49a varies the excitations of the first transfer lens 34a and second transfer lens 34b such that both lenses 34a, 34b are more strongly excited or both lenses 34a, 34b are more weakly excited.

The second measuring portion 48b performs processing to measure on-axis aberrations. The second measuring portion 48b creates a diffractogram tableau, for example, and measures on-axis aberrations. The second measuring portion 48b operates to control the deflection coils (alignment coils 13) of the illumination system and the imager 22, to tilt the incident beam by about 1 to 2 degrees, to take amorphous images while incrementally varying the azimuthal angle, and to obtain the amorphous images. The second measuring portion 48b Fourier transforms the plural amorphous images, obtains the plural diffractograms corresponding to the amorphous images, and measures on-axis aberrations.

The second transfer lens system controller 49b provides control based on the results of measurements made by the second measuring portion 48b such that the excitation of the transfer lens system 34 is varied to correct three-lobe aberration. The second transfer lens system controller 49b varies the excitations of the first transfer lens 34a and second transfer lens 34b such that one of these two lenses 34a, 34b becomes more strongly excited while the other becomes more weakly excited.

Since the excitation of the transfer lens system 34 is varied by the second transfer lens system controller 49b in order to correct three-lobe aberration, off-axis two-fold astigmatism may be introduced again. For this reason, the decision unit 49c makes a decision as to whether or not off-axis two-fold astigmatism has been corrected.

The decision unit 49c makes a decision based on a quantitative value of the three-fold symmetric component of the off-axis two-fold astigmatism that has been quantified, for example, based on the plural diffractograms. If the quantitative value of the three-fold symmetric component of the off-axis two-fold astigmatism is equal to or below a given value, the decision unit 49c determines that the off-axis two-fold astigmatism has been corrected. If the quantitative value is greater than the given value, the decision unit determines that the off-axis two-fold astigmatism has not been corrected.

3.2. Operation of Transmission Electron Microscope

The operation of the transmission electron microscope 300 associated with the third embodiment is next described. In the present embodiment, the first measuring portion 48a, second measuring portion 48b, first transfer lens system controller 49a, and second transfer lens system controller 49b cooperate to correct off-axis two-fold astigmatism. That is, in the transmission electron microscope 300, off-axis two-fold astigmatism can be corrected automatically.

Figure 21:
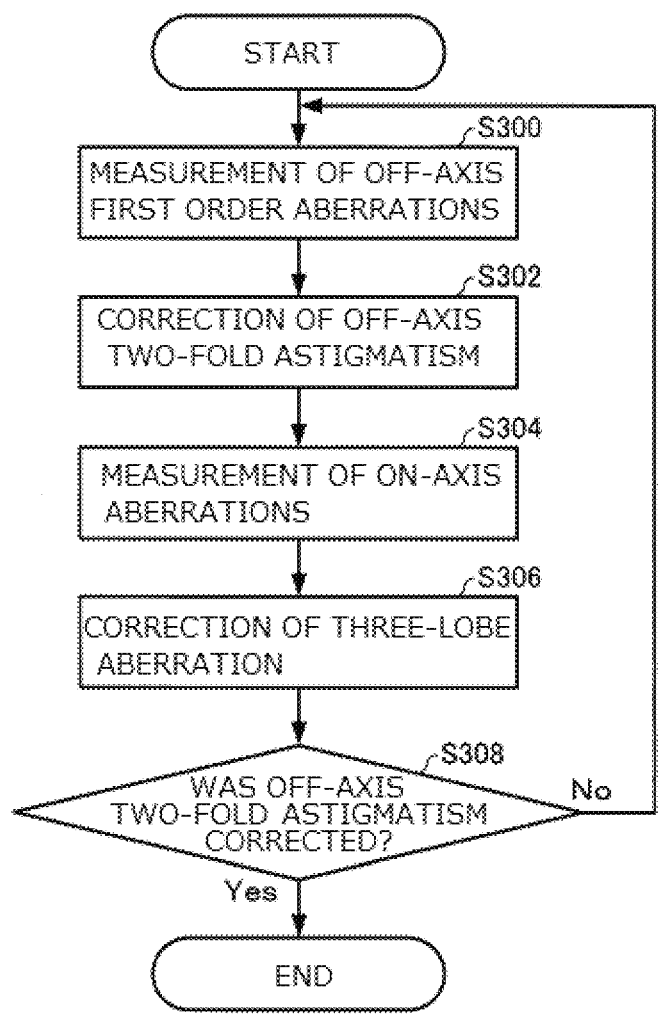
FIG. 21 is a flowchart illustrating one example of processing subroutine of the electron microscope shown in FIG. 20.

FIG. 21 is a flowchart illustrating one example of operational sequence of the transmission electron microscope 300 associated with the third embodiment. For example, if the user asks the processing section 40 to initiate an aberration correction via the manual control unit 50, the processing section 40 accepts a control signal from the manual control unit 50 and starts a subroutine for aberration correction.

First, the first measuring portion 48a measures off-axis first order aberrations (step S300).

Then, the first transfer lens system controller 49a provides control based on the results of the measurements made by the first measuring portion 48a to vary the excitation of the transfer lens system 34 for correcting the off-axis two-fold astigmatism (step S302).

Then, the second measuring portion 48b performs processing to measure on-axis aberrations (step S304).

The second transfer lens system controller 49b provides control based on the results of measurements made by the second measuring portion 48b to vary the excitation of the transfer lens system 34 such that three-lobe aberration is corrected (step S306).

The decision unit 49c then makes a decision as to whether the off-axis two-fold astigmatism has been corrected (step S308).

If the decision at step S308 is negative (No), indicating that the off-axis two-fold astigmatism has not been corrected, control passes back to step S300, and the steps S300-S308 are performed.

On the other hand, if the decision at step S308 is Yes, indicating that the off-axis two-fold astigmatism has been corrected, the processing section 40 ends the present processing subroutine described so far. Because of the processing sequence described so far, off-axis two-fold astigmatism can be corrected.

The transmission electron microscope 300 has the following features. The transmission electron microscope 300 includes the first measuring portion 48a for measuring off-axis first order aberrations and the first transfer lens system controller 49a for providing control based on the results of measurements made by the first measuring portion 48a to vary the excitation of the transfer lens system 34 for correcting the off-axis two-fold astigmatism. Therefore, in the transmission electron microscope 300, off-axis two-fold astigmatism can be corrected. Furthermore, in the transmission electron microscope 300, off-axis two-fold astigmatism can be corrected automatically and so off-axis two-fold astigmatism can be easily corrected.

Furthermore, the transmission electron microscope 300 includes the second measuring portion 48b for measuring on-axis aberrations and the second transfer lens system controller 49b for providing control based on the results of measurements made by the second measuring portion 48b to vary the excitation of the transfer lens system 34 for correcting three-lobe aberration. Therefore, in the transmission electron microscope 300, three-lobe aberration occurring concomitantly with correction of off-axis two-fold astigmatism can be corrected. In addition, in the transmission electron microscope 300, three-lobe aberration can be corrected automatically and, therefore, three-lobe aberration can be corrected easily.

In the foregoing description, an example is presented in which the transmission electron microscope 300 is configured including the aberration corrector 30 that includes the two stages of multipole elements 32a and 32b. Alternatively, the transmission electron microscope 300 may be configured including the aberration corrector 230 having the three stages of multipole elements 32a, 32b, and 32c. Even in the transmission electron microscope 300 of this construction, correction of off-axis two-fold astigmatism can be automated in the same manner as described above.

Furthermore, in the foregoing description, an example is given in which the processing section 40 makes an aberration correction in accordance with the flowchart of FIG. 21. Alternatively, the processing section 40 may make an aberration correction in accordance with the flowchart illustrated in FIG. 3. In the flowchart of FIG. 3, steps S100, S102, S106, and S108 may be performed in the same way as steps S300, S302, S304, and S306 illustrated in FIG. 21. Furthermore, steps S104, S110, and S112 illustrated in FIG. 3 may be executed by the decision unit 49c.

It is to be understood that the above embodiments and modifications are merely exemplary and that the invention is not restricted thereto. For example, the embodiments and modifications can be appropriately combined.

In the above-described first embodiment, the aberration corrector 30 has the two stages of multipole elements. In the second embodiment described above, the aberration corrector 30 has the three stages of multipole elements. The method of aberration correction associated with the present invention is similarly applicable in the case where the aberration corrector has four or more stages of multipole elements.

Additionally, in the above embodiments, examples have been given in which each multipole element of the aberration correctors 30 and 230 produces a three-fold field (three-fold symmetric field). The field produced by each multipole element of the aberration corrector 30 or 230 may also be an N-fold field as described previously. Where the field generated by each multipole element is not a three-fold field, off-axis two-fold astigmatism may have a symmetry other than three-fold symmetry. In this case, when the excitation of the transfer lens system is varied to correct off-axis two-fold astigmatism, on-axis aberrations other than three-lobe aberration may be incurred. Even in this case, the method of aberration correction associated with the present invention is applicable in the same way as in the case where the field produced by each of the above-described multipole elements is a three-fold field.

The present invention embraces configurations substantially identical (e.g., in function, method, and results or in purpose and advantageous effects) with the configurations described in any one of the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. A method of aberration correction for use in a charged particle beam system equipped with an aberration corrector that includes plural stages of multipole elements and a transfer lens system disposed between the multipole elements, said method comprising the step of:
    varying the excitation of the transfer lens system and correcting off-axis first order aberrations.

2. The method of aberration correction as set forth in claim 1, wherein said transfer lens system has a first transfer lens and a second transfer lens.

3. The method of aberration correction as set forth in claim 2, wherein during said step of correcting off-axis first order aberrations, the excitations of said first and second transfer lenses are varied such that the first and second transfer lenses are both more strongly excited or both more weakly excited.

4. The method of aberration correction as set forth in claim 2, further comprising the step of varying the excitation of said transfer lens system and correcting the on-axis aberrations.

5. The method of aberration correction as set forth in claim 4, wherein during said step of correcting on-axis aberrations, the excitations of said first and second transfer lenses are varied such that one of the first and second transfer lenses is more strongly excited while the other is more weakly excited.

6. The method of aberration correction as set forth in claim 4, wherein during said step of correcting on-axis aberrations, three-lobe aberration is corrected.

7. The method of aberration correction as set forth in claim 1, wherein during said step of correcting off-axis first order aberrations, off-axis two-fold astigmatism is corrected.

8. The method of aberration correction as set forth in claim 1, wherein each of said multipole elements produces a three-fold field.

9. The method of aberration correction as set forth in claim 1, further comprising the step of measuring said off-axis first order aberrations;
wherein said step of measuring the off-axis first order aberrations includes the steps of: moving a field of view by deflection coils of an imaging system of said charged particle beam system and taking and obtaining plural amorphous images; obtaining plural diffractograms corresponding to the amorphous images; and measuring said off-axis first order aberrations on the basis of the diffractograms; and
wherein during said step of correcting off-axis first order aberrations, the off-axis first order aberrations are corrected by varying the excitation of said transfer lens system on the basis of results of measurements of the off-axis first order aberrations.

10. The method of aberration correction as set forth in claim 1, further comprising the step of measuring said off-axis first order aberrations;
wherein said step of measuring off-axis first order aberrations includes the steps of: obtaining an amorphous image; selecting mutually different plural regions from the amorphous image and obtaining plural diffractograms corresponding to the selected regions; and measuring the off-axis first order aberrations on the basis of the plural diffractograms; and
wherein during said step of correcting off-axis first order aberrations, the off-axis first order aberrations are corrected by varying the excitation of the transfer lens system on the basis of results of measurements of the off-axis first order aberrations.

11. A charged particle beam system comprising:
an aberration corrector having plural stages of multipole elements and a transfer lens system disposed between the multipole elements;
a first measuring portion for measuring off-axis first order aberrations; and
a first transfer lens system controller for providing control based on results of measurements made by the first measuring portion to vary the excitation of the transfer lens system such that the off-axis first order aberrations are corrected.

12. The charged particle beam system as set forth in claim 11, further comprising:
a second measuring portion for measuring on-axis aberrations; and
a second transfer lens system controller for providing control based on results of measurements made by the second measuring portion to vary the excitation of the transfer lens system such that the on-axis aberrations are corrected.

* * * * *